（12）United States Patent
Lee et al.

(10) Patent No.: US 8,963,173 B2
(45) Date of Patent: Feb. 24, 2015

(54) LIGHT EMITTING DEVICE HAVING STRONTIUM OXYORTHOSILICATE TYPE PHOSPHORS

(75) Inventors: Chung Hoon Lee, Ansan-si (KR); Walter Tews, Greifswald (DE); Gundula Roth, Levenhagen (DE); Detlef Starick, Greifswald (DE)

(73) Assignees: Seoul Semiconductor Co., Ltd., Ansan-si (KR); LITEC-LP GmbH, Greifswald (DE)

( * ) Notice: Subject to any disclaimer, the term of this patent is extended or adjusted under 35 U.S.C. 154(b) by 84 days.

(21) Appl. No.: 12/972,996

(22) Filed: Dec. 20, 2010

(65) Prior Publication Data

US 2012/0001205 A1    Jan. 5, 2012

(30) Foreign Application Priority Data

Dec. 21, 2009  (DE) .................... 10 2009 059 798
Apr. 16, 2010  (KR) .................... 10-2010-0035190

(51) Int. Cl.
  *H01L 29/20*    (2006.01)
  *C09K 11/77*    (2006.01)
  *H01L 33/50*    (2010.01)
  *H01L 33/64*    (2010.01)

(52) U.S. Cl.
  CPC ............. *C09K 11/7734* (2013.01); *H01L 33/50* (2013.01); *H01L 33/647* (2013.01)
  USPC ........................................................ 257/89

(58) Field of Classification Search
  USPC ........................................................ 257/89
  See application file for complete search history.

(56) References Cited

U.S. PATENT DOCUMENTS

| 7,554,129 B2 | 6/2009 | Roth et al. |
| 7,648,650 B2 | 1/2010 | Liu et al. |
| 8,173,042 B2 * | 5/2012 | Lee et al. ............... 252/301.4 F |
| 8,188,492 B2 * | 5/2012 | Lee et al. ...................... 257/89 |
| 2005/0274930 A1 | 12/2005 | Roth et al. |

(Continued)

FOREIGN PATENT DOCUMENTS

| CN | 201213135 | 3/2009 |
| CN | 101595201 | 12/2009 |

(Continued)

OTHER PUBLICATIONS

"Application of Strontium Silicate Yellow Phosphor for White Light-emitting Diodes" by Park, Joung-Kyu, et al., in Appl. Phys. Lett. 84 (2004), 1647-49.

(Continued)

*Primary Examiner* — David Vu
*Assistant Examiner* — Brandon Fox
(74) *Attorney, Agent, or Firm* — H.C. Park & Associates, PLC

(57) ABSTRACT

Exemplary embodiments of the present invention relate to light emitting devices including strontium oxyorthosilicate-type phosphors. The light emitting device includes a light emitting diode, which emits light in the UV or visible range, and phosphors disposed around the light emitting diode to absorb light emitted from the light emitting diode and emit light having a different wavelength from the absorbed light. The phosphors include an oxyorthosilicate phosphor having a general formula of $Sr_{3-x-y-z}Ca_xM^{II}_y SiO_5:Eu_z$ with a calcium molar fraction in the range of $0 < x \leq 0.05$.

20 Claims, 7 Drawing Sheets

(56) References Cited

U.S. PATENT DOCUMENTS

| | | |
|---|---|---|
| 2006/0012284 A1 | 1/2006 | Kim et al. |
| 2006/0163683 A1 | 7/2006 | Roth et al. |
| 2007/0029526 A1 | 2/2007 | Cheng et al. |
| 2008/0111472 A1* | 5/2008 | Liu et al. ............... 313/503 |
| 2008/0231166 A1 | 9/2008 | Su |
| 2009/0072255 A1 | 3/2009 | Takahashi et al. |
| 2009/0289546 A1 | 11/2009 | Igarashi et al. |
| 2010/0079058 A1 | 4/2010 | Schmidt et al. |
| 2010/0200874 A1* | 8/2010 | Shioi et al. ............... 257/91 |
| 2011/0062469 A1* | 3/2011 | Camras et al. ............ 257/98 |
| 2011/0068697 A1* | 3/2011 | Hum ....................... 315/152 |
| 2012/0181481 A1* | 7/2012 | Lee et al. ............ 252/301.6 R |

FOREIGN PATENT DOCUMENTS

| | | |
|---|---|---|
| DE | 19528758 | 12/1996 |
| JP | 2004-161982 | 6/2004 |
| JP | 2008-081631 | 4/2008 |
| KR | 10-2007-0082952 | 8/2007 |
| WO | 2004-056939 | 7/2004 |
| WO | 2004-067677 | 8/2004 |
| WO | 2004/085570 | 10/2004 |
| WO | 2006/081803 | 8/2006 |
| WO | 2006-131795 | 12/2006 |
| WO | 2007-004138 | 1/2007 |

OTHER PUBLICATIONS

"Photoluminescence properties of Eu2+-activated Sr3SiO5 phosphors" by Lee, Soon-Duk, et al., in J. Mater. Sci. 41 (2006), 3139-41.

International Search Report of PCT/KR2010/008922 mailed on Aug. 18, 2011.
Written Opinion of PCT/KR2010/008922 mailed on Aug. 18, 2011.
Non-Final Office Action of U.S. Appl. No. 12/879,361 issued on Mar. 21, 2011.
International Search Report of PCT/KR2010/005836 mailed on May 24, 2011.
Written Opinion of PCT/KR2010/005836 mailed on May 24, 2011.
Notice of Allowance of U.S. Appl. No. 12/879,361 dated Feb. 3, 2012.
Final Office Action of U.S. Appl. No. 13/434,529 dated Oct. 5, 2012.
Chinese First Office Action issued on Dec. 3, 2013 in Chinese Patent Application No. 201080058655.4.
Final Office Action issued on Oct. 17, 2011 in U.S. Appl. No. 12/879,361.
Chinese First Office Action issued on Jul. 2, 2013 in Chinese Patent Application No. 201080028841.3.
Extended European Search Report issued on Jul. 18, 2013 in European Patent Application No. 10 83 9661.
Chinese First Office Action issued on Nov. 15, 2013 in Chinese Patent Application No. 201080058589.0.
Notice of Allowance of U.S. Appl. No. 13/434,529 dated Feb. 1, 2013.
Extended European Search Report issued on Jul. 9, 2013 in European Patent Application No. 10839706.
Twainese Preliminary Notice of First Office Action issued on Sep. 18, 2013 in Twainese Patent Application No. 099144790.
H. S. Jang, et al., "Emission Band Change of $(Sr_{1-x}M_x)_3SiO_5$:Eu<2+> (M=Ca, Ba) phosphor for white light sources using blue/near-ultraviolet LEDs", Journal of the electrochemical Society, vol. 156, No. 6, Apr. 6, 2009 pp. J138-J142.

\* cited by examiner

Fig. 8

| Materials | Ca content molar fractions x | Lattice constants | | Phase composition | | | |
|---|---|---|---|---|---|---|---|
| | | a = b | c | $Sr_3SiO_5$ tetragonal | $Sr_2SiO_4$ orthorhombic | $Sr_2SiO_4$ monoclinic | |
| Commercially available $Sr_3SiO_5$:Eu | | 6.962 | 10.771 | 91 | 7 | 2 | |
| $Sr_{2.95}Ba_{0.01}Eu_{0.04}SiO_5$ – Reference | | 6.957 | 10.770 | 93 | 5 | 2 | |
| $Sr_{2.95-x}Ba_{0.01}Ca_xEu_{0.04}SiO_5$ | 0.01 | 6.953 | 10.765 | 95 | 5 | | |
| $Sr_{2.95-x}Ba_{0.01}Ca_xEu_{0.04}SiO_5$ | 0.02 | 6.950 | 10.760 | 93 | 7 | | |
| $Sr_{2.95-x}Ba_{0.01}Ca_xEu_{0.04}SiO_5$ | 0.05 | 6.949 | 10.761 | 90 | 8 | 2 | |
| $Sr_{2.95-x}Ba_{0.01}Ca_xEu_{0.04}SiO_5$ | 0.075 | 6.947 | 10.755 | 79 | 19 | 2 | |
| $Sr_{2.95-x}Ba_{0.01}Ca_xEu_{0.04}SiO_5$ | 0.1 | 6.945 | 10.752 | 58 | 42 | | |
| $Sr_{2.95-x}Ba_{0.01}Ca_xEu_{0.04}SiO_5$ | 0.15 | 6.937 | 10.755 | 9 | 84 | 5 | |

Fig. 9

| Material | Powder intensity 450 nm excitation % | Colour coordinates | | FWHM nm | Intensity 150°C % |
|---|---|---|---|---|---|
| | | x value | y value | | |
| Commercially available $Sr_3SiO_5$:Eu | 98.3 | 0.5420 | 0.4560 | 68.1 | 91.3 |
| $Sr_{2.95}Ba_{0.01}Eu_{0-04}SiO_3$ – Reference | 100 | 0.5373 | 0.4604 | 68.4 | 91.5 |
| $Sr_{2.94}Ba_{0.01}Ca_{0.01}Eu_{0.04}SiO_5$ | 100 | 0.5396 | 0.4581 | 67.8 | 92.1 |
| $Sr_{2.93}Ba_{0.01}Ca_{0.02}Eu_{0.04}SiO_5$ | 101.3 | 0.5395 | 0.4582 | 68 | 92.0 |
| $Sr_{2.90}Ba_{0.01}Ca_{0.05}Eu_{0.04}SiO_5$ | 100.8 | 0.5414 | 0.4564 | 68.1 | 91.6 |
| $Sr_{2.875}Ba_{0.01}Ca_{0.075}Eu_{0.04}SiO_5$ | 92.5 | 0.5401 | 0.4575 | 70.3 | 87.5 |
| $Sr_{2.85}Ba_{0.01}Ca_{0.1}Eu_{0.04}SiO_5$ | 79.3 | 0.5374 | 0.4599 | 72.6 | 85.2 |
| $Sr_{2.80}Ba_{0.01}Ca_{0.15}Eu_{0.04}SiO_5$ | 52.2 | 0.5142 | 0.4782 | 86.7 | 70.8 |

Fig. 10

| Material | Powder intensity 450 nm excitation % | Intensity 150°C % | Intensity after moist atmosphere test % |
|---|---|---|---|
| Commercially available $Sr_3SiO_5$:Eu | 98.3 | 91.3 | 69.3 |
| $Sr_{2.95}Ba_{0.01}Eu_{0.04}SiO_5$ – Reference | 100 | 91.6 | 72.0 |
| $Sr_{2.94}Ba_{0.01}Ca_{0.01}Eu_{0.04}SiO_5$ | 100 | 92.1 | 91.2 |
| $Sr_{2.93}Ba_{0.01}Ca_{0.02}Eu_{0.04}SiO_5$ | 101.3 | 92.0 | 96.3 |
| $Sr_{2.90}Ba_{0.01}Ca_{0.05}Eu_{0.04}SiO_5$ | 100.8 | 91.6 | 94.6 |
| $Sr_{2.875}Ba_{0.01}Ca_{0.075}Eu_{0.04}SiO_5$ | 92.5 | 87.5 | 85.8 |
| $Sr_{2.85}Ba_{0.01}Ca_{0.1}Eu_{0.04}SiO_5$ | 79.3 | 85.2 | 77.3 |
| $Sr_{2.80}Ba_{0.01}Ca_{0.15}Eu_{0.04}SiO_5$ | 52.2 | 70.8 | 71.7 |

LIGHT EMITTING DEVICE HAVING STRONTIUM OXYORTHOSILICATE TYPE PHOSPHORS

CROSS-REFERENCE TO RELATED APPLICATIONS

This application claims priority from and the benefit of German Patent Application No. 10 2009 059 798.0, filed on Dec. 21, 2009, and Korean Patent Application No. 2010-0035190, filed on Apr. 16, 2010, which are hereby incorporated by reference for all purposes as if fully set forth herein.

BACKGROUND

1. Field

Exemplary embodiments of the present invention relate to light emitting devices having inorganic phosphors based on silicate compounds.

2. Discussion of the Background

Phosphors may be used in light sources, such as light emitting diodes (LEDs) that emit colored or white light. In an LED, phosphors, which may be used in combination with other luminophores, are used to convert ultraviolet or blue primary radiation emitted from an LED into longer wavelength secondary radiation, in particular, white light.

Although various phosphors having a high luminescent output, such as, cerium-doped yttrium aluminum garnets, europium-activated alkaline earth metal orthosilicates, and similarly doped nitrides having various compositions, have already been disclosed for these applications, further attempts have been made to develop improved materials for use in LEDs. Such development trends consist of, in particular, finding phosphors having improved temperature characteristics and having higher stability under a resulting radiation load, under the influence of atmospheric humidity, and under other environmental factors. Such luminophores may be required for the production of LED lamps having relatively high power consumption and improved lifetimes.

Europium-activated alkaline earth metal oxyorthosilicates of the general formula $Sr_3SiO_5$:Eu have been used for LEDs that emit colored or white light. Such phosphors are described, for example, in WO 2004/085570A1 and WO 2006/081803A1, and in various scientific publications, such as "Application of Strontium Silicate Yellow Phosphor for White Light-emitting Diodes" by Park, Joung-Kyu, et al., in Appl. Phys. Lett. 84 (2004), 1647-49, and "Photoluminescence properties of $Eu^{2+}$-activated $Sr_3SiO_5$ phosphors" by Lee, Soon-Duk, et al., in J. Mater. Sci. 41 (2006), 3139-41, the entirety of which are hereby incorporated by reference in their entirety for all purposes, as if fully set forth herein.

The known luminophores emit light in the yellow to orange range of the visible spectrum and are distinguished by high luminescent efficiency and extremely low thermal quenching, up to a temperature of 250° C. In this respect, these luminophores are substantially superior to the orthosilicates, which also emit light in the range of 580 and 610 nm, as an orange component in phosphor mixtures for warm white LEDs and, owing to their advantageous properties and substantially lower production costs, may compete even with the red-emitting nitride phosphors that are increasingly favored for these applications.

Under certain conditions, however, LEDs including such phosphors may have a comparatively short lifetime. A possible cause of this disadvantageous behavior may be the relatively high moisture sensitivity of the europium-doped alkaline earth metal oxyorthosilicates. Due to such instability, industrial applicability of these luminophores may be limited in certain areas.

SUMMARY

Exemplary embodiments of the present invention disclose light emitting devices including chemically modified oxyorthosilicate phosphors having increased stability under exposure to atmospheric humidity and which are suitable as efficient radiation converters for use in different technical applications.

An exemplary embodiment of the present invention discloses a light emitting device including: a light emitting diode; and phosphors disposed around the light emitting diode to absorb at least a portion of light emitted from the light emitting diode and to emit light having a different wavelength from the absorbed light, wherein the phosphors comprise an oxyorthosilicate phosphor having the formula $Sr_{3-x-y-z}Ca_xM^{II}_ySiO_5$:$Eu_z$, wherein $M^{II}$ is a divalent metal ion including at least one of Mg, Ba, Cu, Zn, and Mn, $0<x\leq0.05$, $0\leq y\leq0.5$, and $0<z\leq0.25$.

It is to be understood that both the foregoing general description and the following detailed description are exemplary and explanatory and are intended to provide further explanation of the invention as claimed. Additional features of the invention will be set forth in the description which follows, and in part will be apparent from the description, or may be learned by practice of the invention.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain various aspects of the present invention.

FIG. 8 shows lattice constants and the fractions, calculated from the diffraction diagram, of the different crystallographic phases.

FIG. 9 shows optical and performance parameters of exemplary phosphors having a low Ca fraction and of comparative materials.

FIG. 10 shows investigation results of moisture stability of oxyorthosilicate phosphors having a low Ca molar fraction, according to an exemplary embodiment of the present invention, and of silicate mixed phases.

DETAILED DESCRIPTION OF THE ILLUSTRATED EMBODIMENTS

Figure 1:
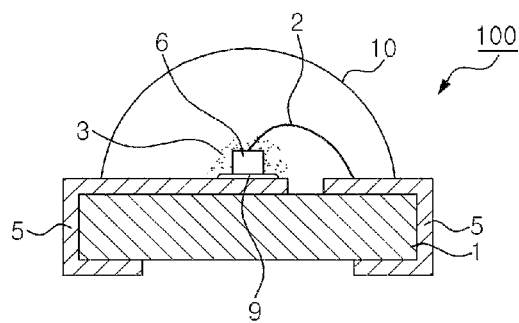
FIG. 1 is a cross-sectional view of a light emitting device 100, according to an exemplary embodiment of the present invention.

The exemplary embodiments of the present invention are described more fully hereinafter with reference to the accompanying drawings, wherein like reference numerals refer to like elements throughout. This invention may, however, be embodied in many different forms and should not be construed as being limited to the exemplary embodiments set forth herein. Rather, these exemplary embodiments are provided so that this disclosure is thorough, and will fully convey the scope of the invention to those skilled in the art. In the drawings, the shapes and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

According to exemplary embodiments of the present disclosure, a light emitting device includes a light emitting diode that emits light in the UV or visible range, and phosphors disposed around the light emitting diode to absorb at least a portion of light emitted from the light emitting diode and to emit light having a different wavelength from the absorbed light. According to an exemplary embodiment, a small amount of strontium (Sr) is selectively replaced by calcium (Ca) in a parent phosphor $Sr_3SiO_5$ lattice, without changing the stoichiometry of the compound or the crystal structure thereof. Such a substitution leads to increased stability of a resultant europium-activated oxyorthosilicate luminophore, under exposure to atmospheric humidity and other environmental factors, and also provides for a significant improvement in lifetime of LEDs including the same.

The advantageous effects of calcium substitution generally occur within a particular calcium concentration range. If this range is exceeded, the result of the continued incorporation of calcium into the $Sr_3SiO_5$ matrix is that the desired alkaline earth metal oxyorthosilicates may no longer formed in the fundamental phosphor product. Instead, the corresponding orthosilicates of the composition $(Sr, Ca)_2SiO_4$, having a significantly increased concentration of calcium, are almost exclusively formed.

In the case of mixed silicates having the general formula $(Sr_{1-x-y}Ca_xBa_y)_3SiO_5:Eu_z$ as disclosed in WO 2006/081803A1, in which x may assume a value of up to 0.3, X-ray structure investigations have shown that the desired alkaline earth metal oxyorthosilicate phosphors can no longer be synthesized with a calcium molar fraction of x>0.05, under conventional preparation conditions. Instead, alkaline earth metal orthosilicates are predominantly formed. However, the incorporation of small amounts of calcium, where x<0.05, which does not interfere with formation of the $Sr_3SiO_5$ lattice, leads to a substantial improvement in the moisture resistance of the corresponding europium-doped luminophores and a significant increase in lifetime of LEDs produced therefrom.

The strontium oxyorthosilicate phosphors, according to an exemplary embodiment of the present disclosure, which have improved stability to the resulting radiation load and resistance to influence of atmospheric humidity, may be described by the general formula $Sr_{3-x-y-z}Ca_xM^{II}_ySiO_5:Eu_z$, where the calcium molar fraction x is in the range of 0<x≤0.05, and the europium molar fraction z typically has a value of less than or equal to 0.25. The optimum activator concentration generally depends on a specific application to which the phosphors will be applied and may be determined experimentally.

In the general formula, $M^{II}$ represents additional divalent metal ions that are selected from the group consisting of magnesium (Mg), barium (Ba), copper (Cu), zinc (Zn) and manganese (Mn). The divalent metal ions may be optionally incorporated into the parent phosphor lattice. With barium, however, it is possible to achieve a complete replacement of the strontium. The fraction of the other divalent metal ions additionally substituted for the strontium may be up to y=0.5. Alternatively and/or in addition to europium (Eu), divalent rare earth metal ions, such as samarium (Sm) or ytterbium (Yb), or specific trivalent rare earth metal ions, for example, cerium ions ($Ce^{3+}$), may also serve as suitable activators.

For the purpose of improving luminescent properties and stability, the compositions of these phosphors may be further modified. For example, silicon (Si) may be replaced by germanium (Ge) and/or aluminum (Al), gallium (Ga), boron (B), or phosphorus (P). However, suitable measures to preserve the charge balance may be needed in the last-mentioned cases. For example, monovalent cations such as lithium (Li), sodium (Na), and potassium (K); or anions such as fluorine (F), chlorine (Cl), bromine (Br), or iodine (I), may be further incorporated into the parent lattice. In an exemplary embodiment of the present disclosure, phosphors having improved stability under a resulting radiation load and resistance to the influence of atmospheric humidity have the formula $Sr_{3-x-y-z}Ca_xBa_ySiO_5:Eu_z$, with molar fractions of 0<x≤0.05, 0≤y≤0.5, and z≤0.25.

Upon excitation with high energy radiation, the phosphors emit light in the visible spectrum, preferably in the range between 560 and 620 nm, depending on their specific chemical composition. The excitability of the $Eu^{2+}$-activated luminescence ranges from 220 nm in the UV range to 550 nm in the visible range, which means that the luminophores according to exemplary embodiments may be excited with green light to produce yellow, orange, or red light. Furthermore, intense and technically attainable luminescence also occurs when the phosphors having a very low Ca molar fraction, according to exemplary embodiments, are irradiated by electron beams, X-rays, or gamma rays.

The phosphors having the very low Ca fraction, according to the exemplary embodiments, may be used as radiation converters for converting ionizing gamma rays, X-rays, electron beams, and ultraviolet, blue, and/or green light into longer-wavelength visible light in the yellow, orange, and red ranges. Thus, the phosphors may be used in a multiplicity of technical devices, for example, in cathode ray tubes and other image-producing systems (scanning laser beam systems), in X-ray image converters, in fluorescent lamps and LEDs emitting colored and white light, in solar cells or greenhouse sheets and glasses, as wavelength converters, alone or in combination with other blue, green, yellow and/or red-emitting phosphors.

The light emitting device, according to the exemplary embodiments, may realize white light or a desired color of light through a combination of the light emitting diode and the phosphors. For example, white light or a desired color of light may be realized by mixing light emitted from the light emitting diode and light emitted from the phosphors. Furthermore, other phosphors may be added to the light emitting device to realize another desired color of light. The phosphors may be disposed on at least one of lateral, upper, and lower sides of the light emitting diode. Further, the phosphors may be mixed with an adhesive or a molding material, so as to be disposed around the light emitting diode.

The light emitting diode and the phosphors may be combined in a single package. According to one exemplary embodiment, the light emitting device may further include another light emitting diode in the package. The other light emitting diode may emit light having the same wavelength as, or a different wavelength from, the light emitted from the light emitting diode. For example, the other light emitting diode may emit light having a longer wavelength than an emission peak wavelength of the phosphor.

The package may include a substrate such as a printed circuit board or lead frame, on which the light emitting diode is mounted. According to one exemplary embodiment, the package may further include a reflector that reflects light emitted from the light emitting diode. In this case, the light emitting diode is mounted within the reflector.

The light emitting device may further include a molding member that encapsulates the light emitting diode on the substrate. The phosphors may be dispersed in the molding member, but are not limited thereto. The package may further include a heat sink, and the light emitting diode may be mounted on the heat sink.

According to exemplary embodiments, the light emitting diode may be formed of (Al, Ga, In)N-based compound semiconductors. The light emitting diode may have, for example, a double-hetero structure, a single quantum well structure, or multi-quantum well structure, wherein a single active region between an n-type semiconductor layer and a p-type semiconductor layer.

The light emitting diode may further include a plurality of light emitting cells that are separated from each other and disposed on a single substrate. Each of the light emitting cells may have an active region. The light emitting cells may be electrically connected to one another in series and/or in parallel, via wires. With these light emitting cells, it is possible to provide an alternating current (AC) light emitting diode which may be directly driven by an AC power supply. Such an AC-light emitting diode may be driven without an additional AC/DC converter, by forming a bridge rectifier and serial arrays of light emitting cells connected to the bridge rectifier on a single substrate, or by forming serial arrays of light emitting cells connected in reverse-parallel to one another on a single substrate.

According to exemplary embodiments of the present invention, the phosphors have improved stability under the resulting radiation load and improved resistance to atmospheric humidity. Thus, the light emitting device including the phosphors has an improved lifetime.

FIG. 1 is a cross-sectional view of a light emitting device 100 according to an exemplary embodiment of the present disclosure. The light emitting device 100 may be referred to as a chip-type package. Referring to FIG. 1, electrodes 5 may be formed on both sides of a substrate 1, and a light emitting diode 6 emitting primary light may be mounted on one of the electrodes 5, at one side of the substrate 1. The light emitting diode 6 may be mounted on the electrode 5 via an electrically conductive adhesive 9, such as Ag epoxy, and may be electrically connected to the other electrode 5 via an electrically conductive wire 2. The light emitting diode 6 emits light in the ultraviolet range or visible range and may be formed of gallium nitride-based compound semiconductors. Particularly, the light emitting diode 6 may emit UV or blue light.

Phosphors 3 may be dotted on upper and side surfaces of the light emitting diode 6. A molding member 10, for example, a thermosetting resin, encapsulates the light emitting diode 6. The phosphors 3 are dotted around the light emitting diode 3, but not limited to any particular configuration. For example, the phosphors 3 may be uniformly distributed within the molding member 10. The phosphors 3 absorb at least a portion of light emitted from the light emitting diode 6 and emit light having a different wavelength from the absorbed light.

The light emitting diode 6 is electrically connected to an external power supply via the electrodes 5 and thus, emits primary light. The phosphors 3 absorb at least a portion of the primary light and emit secondary light having a wavelength that is longer than that of the primary light. As a result, the primary light and the secondary light are mixed to form mixed light, which is emitted from the light emitting device 100. A desired color of light, for example white light, may be realized in this manner.

The light emitting device 100 may include one or more additional light emitting diodes. These light emitting diodes may emit light having the same emission peaks or different emission peaks. For example, the light emitting device 100 may include the same or different types of light emitting diodes, each of which can emit ultraviolet or blue light. Furthermore, the light emitting device 100 may include a light emitting diode that can emit light having a longer wavelength than the emission peak wavelength of the phosphors. Such a longer wavelength light emitting diode may be employed to improve a color rendering index of the light emitting device 100. Moreover, the light emitting device 100 may further include other phosphors in addition to the phosphors 3. Examples of the other phosphors include, but are not limited to, orthosilicate phosphors, Yttrium Aluminum Garnet (YAG) based phosphors, and thiogallate phosphors. Accordingly, a desired color of light may be achieved by the proper selection of the light emitting diodes 6 and phosphors.

Figure 2:
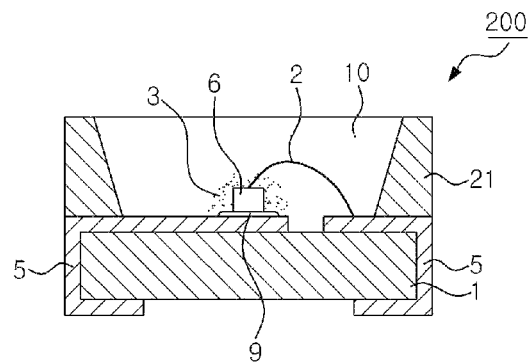
FIG. 2 is a cross-sectional view of a light emitting device 200, according to another exemplary embodiment of the present invention.

FIG. 2 is a cross-sectional view of a light emitting device 200, according to another exemplary embodiment of the present disclosure. The light emitting device 200 may be referred to as a top-view type package. Referring to FIG. 2, the light emitting device 200 has a similar structure to the light emitting device 100 and further includes a reflector 21 on a substrate 1. A light emitting diode 6 is mounted in the reflector 21. The reflector 21 reflects light emitted from the light emitting diode 6, to increase brightness within a certain angle of view.

Phosphors 3 are disposed around the light emitting diode 6, absorb at least a portion of the light emitted from the light emitting diode 6, and emit light having a different wavelength than the absorbed light. The phosphors 3 may be dotted on the light emitting diode 6 or may be uniformly distributed within a thermosetting resin molding member 10.

The light emitting device 200 may also include one or more additional light emitting diodes, which emit light having the same emission peaks or different emission peaks from one another, and may further include other phosphors in addition to the phosphors 3.

The light emitting devices 100, 200 may include substrates 1 formed of a metallic material, for example a metal printed circuit board (PCB), which exhibits good thermal conductivity. Such a substrate may easily dissipate heat from the light emitting diode 6. Further, a lead frame including lead terminals may be used as the substrate 1. Such a lead frame may be surrounded and supported by the molding member 10, which encapsulates the light emitting diode 6.

In the light emitting device 200, the reflector 21 may be formed of a different material from the substrate 1, although is not limited thereto. For example, the reflector 21 may be formed of the same type of material as the substrate 1. A lead frame having lead terminals may be integrally formed with the substrate 1 and reflector 21, by insert-molding plastics such as polyphthalamide (PPA). Then, the lead terminals may be bent to form the electrodes 5.

Figure 3:
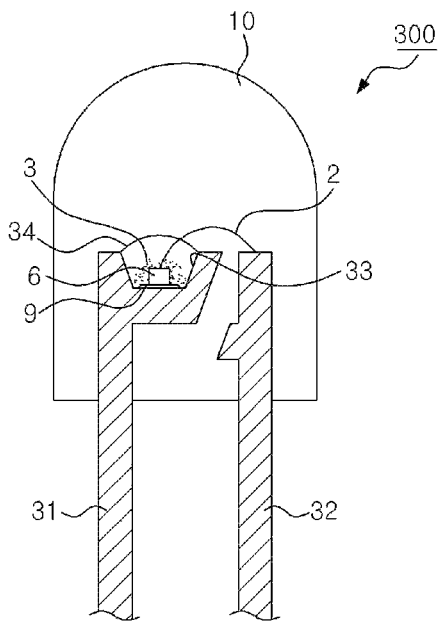
FIG. 3 is a cross-sectional view of a light emitting device 300, according to a further exemplary embodiment of the present invention.

FIG. 3 is a cross-sectional view of a light emitting device 300, according to another exemplary embodiment of the invention. The light emitting device 300 may be referred to as a light emitting diode lamp. Referring to FIG. 3, the light emitting device 300 includes a pair of lead electrodes 31, 32 and a cup portion 33 having a cup shape, at an upper end of one lead electrode 31. At least one light emitting diode 6 may be mounted in the cup portion 33 via an electrically conductive adhesive 9 and electrically connected to the other lead electrode 32 via a conductive wire 2. When a plurality of light emitting diodes is mounted within the cup portion 33, the light emitting diodes may emit light having the same wavelength or different wavelengths from one another.

Phosphors 3 are disposed around the light emitting diode 6. The phosphors 3 absorb at least a portion of light emitted from the light emitting diode 6 and emit light having a different wavelength from that of the absorbed light. The phosphors 3 may be dotted on the light emitting diode 6 in the cup portion 33, or uniformly distributed within a thermosetting resin molding member 34 formed in the cup portion 33.

A molding member 10 encapsulates the light emitting diode 6, the phosphors, and a portion of the lead electrodes 31, 32. The molding member 10 may be formed of, for example, epoxy or silicone. In this embodiment, the light emitting device 300 includes the pair of lead electrodes 31, 32. However, the light emitting device 300 may have more lead electrodes than the pair of lead electrodes 31, 32.

Figure 4:
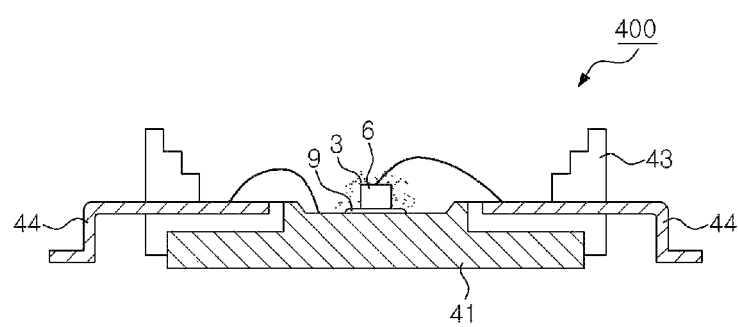
FIG. 4 is a cross-sectional view of a light emitting device 400, according to yet another exemplary embodiment of the present invention.

FIG. 4 is a cross-sectional view of a light emitting device 400, according to yet another exemplary embodiment of the present disclosure. The light emitting device 400 may be referred to as a high-power light emitting diode package. Referring to FIG. 4, the light emitting device 400 includes a heat sink 41 that is received in a housing 43. The heat sink 41 has a bottom surface that is exposed to outside. Lead electrodes 44 are exposed within the housing 43 and extend outside through the housing. At least one light emitting diode 6 may be mounted on an upper surface of the heat sink 41, via an electrically conductive adhesive 9. The light emitting diode 6 is electrically connected to one of the lead electrodes 44, via an electrically conductive wire. Furthermore, another electrically conductive wire connects the other lead electrode 44 to the heat-sink 41, such that the light emitting diode 6 may be electrically connected to each of the two lead electrodes 44.

Phosphors 3 are disposed around the light emitting diode 6, on the heat-sink 41. The phosphors 3 adsorb at least a portion of light emitted from the light emitting diode 6 and emit light having a different wavelength from that of the absorbed light. The phosphors 3 may be dotted on the light emitting diode 6, or uniformly distributed within a molding member (not shown), to cover the light emitting diode.

Figure 5:
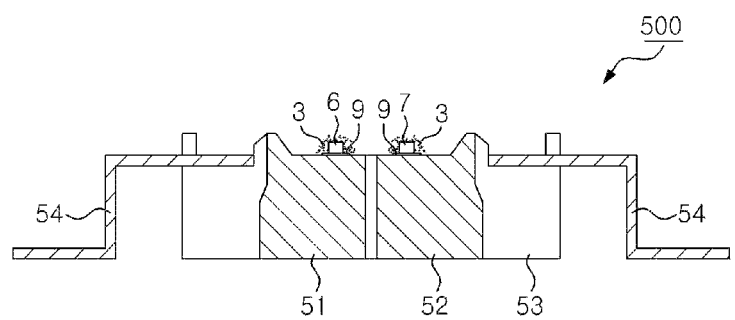
FIG. 5 is a cross-sectional view of a light emitting device 500, according to yet another exemplary embodiment of the present invention.

FIG. 5 is a cross-sectional view of a light emitting device 500, according to yet another exemplary embodiment of the present disclosure. Referring to FIG. 5, the light emitting device 500 includes a housing 53 and a plurality of heat-sinks 51, 52 that may be joined to the housing and insulated from each other. Light emitting diodes 6, 7 are mounted on the heat-sinks 51, 52, via an electrically conductive adhesive. The light emitting diodes 6, 7 are electrically connected to lead electrodes 54, via respective electrically conductive wires (not shown). The lead electrodes 54 extend from the inside of the housing 53 to the outside. Each of the light emitting diodes 6, 7 is connected to two of the lead electrodes 54, but more lead electrodes may be provided thereto. Phosphors 3 may be disposed around at least one of the light emitting diodes 6 or 7, as described with reference to FIG. 4.

In the above exemplary embodiments, it is contemplated that the light emitting diode 6 may be mounted on the substrate 1 or on the heat-sink 41, via the electrically conductive adhesive 9, and electrically connected to the electrode or lead electrode via the electrically conductive wire 2. Those of ordinary skill in the art will recognize that exemplary embodiments may be constrained when the light emitting diode 6 is a "single-bond die," which has its electrodes on the top and bottom sides thereof, respectively. It is observed that where the light emitting diode 6 is a "two-bond die", which has two electrodes on the top side thereof, the light emitting diode 6 may be electrically connected to the electrodes or lead electrodes via two electrically conductive wires, respectively. In this example, the adhesive need not be electrically conductive.

In some exemplary embodiments, the light emitting diode 6 may be formed of an (Al, Ga, In)N-based composite semiconductor. The light emitting diode 6 may have, for example, a double hetero-structure, single quantum well structure, or multi-quantum well structure, which may have a single active region between n-type and p-type semiconductor layers.

By way of example, the light emitting diode may further include a plurality of light emitting cells separated from one another on a single substrate. Each of the light emitting cells may have an active region, and these light emitting cells may be electrically connected to one another in series and/or in parallel to other light emitting cells, via wires. With these light emitting cells, it is possible to provide an AC light emitting diode which may be directly driven by an AC power supply. Such an AC-light emitting diode may be driven without an additional AC/DC converter, by forming a bridge rectifier and serial arrays of light emitting cells connected to the bridge rectifier on a single substrate, or by forming serial arrays of light emitting cells connected in inverse-parallel to one another on a single substrate. The operating voltage of the AC-light emitting diode may be a standard household output voltage, such as 110V or 220V, since the light emitting cells are connected in series via wires. As such, a light emitting device, which may be driven by a household power supply, may be provided.

In some exemplary embodiments, the phosphors 3 may be disposed between the light emitting diode 6 and the substrate 1 or the heat-sink on which the light emitting diode may be mounted, or may be distributed within the adhesive 9. These phosphors 3 may adsorb at least a portion of light emitted downward from the light emitting diode 6, and may emit light having a different wavelength than the absorbed light.

The present invention is not limited to the structures recited above. The structure of the present light emitting devices may be modified in various ways, based on the kind of light emitting diode, an electrical connection method thereof, a desired orientation angle of light, and light emitting device applications.

The phosphors 3 may be strontium oxyorthosilicate phosphors, according to an exemplary embodiment of the present disclosure, which have improved radiation load stability and resistance atmospheric humidity. The phosphors 3 may be described by the general formula $Sr_{3-x-y-z}Ca_xM^{II}_ySiO_5:Eu_z$, where the calcium molar fraction x has a value in the range of $0<x\leq0.05$, and the europium molar fraction z typically has a value less than or equal to 0.25. The activator concentration may be set depending upon the specific conditions of use of the phosphors and may be determined through experimentation.

In the general formula, $M^{II}$ represents additional divalent metal ions which are selected from the group of magnesium (Mg), barium (Ba), copper (Cu), zinc (Zn), and manganese (Mn), which may be optionally incorporated into the parent phosphor lattice. In the case of barium, it is possible to achieve a complete replacement of strontium. The fraction y of the other divalent metal ions that may be substituted for the strontium may be up to y=0.5. Alternatively and in addition to europium (Eu), divalent rare earth ions, such as samarium (Sm) or ytterbium (Yb), or certain trivalent rare earth ions, for example, cerium ions ($Ce^{3+}$), are also suitable as activators.

For the purpose of improving the luminescence properties and the stability, the compositions of the phosphors 3 may be further modified. For example, silicon (Si) may be replaced by germanium (Ge) and/or aluminum (Al), gallium (Ga), boron (B), or phosphorus (P). However, suitable measures to preserve the charge balance may be needed in such cases. For example, monovalent cations such as lithium (Li), sodium (Na), and potassium (K), or anions such as fluorine (F), chlorine (Cl), bromine (Br) and iodine (I) may be further incorporated into the parent lattice. In an exemplary embodiment of the present disclosure, the phosphors 3 have the formula $Sr_{3-x-y-z}Ca_xMII_ySiO_5:Eu_z$, with molar fractions of $0<x\leq0.05$, $0\leq y\leq0.5$, and $z\leq0.25$.

Upon excitation with high energy radiation, the phosphors 3 emit light in the visible spectrum, preferably in the range between 560 and 620 nm, depending on their specific chemical composition. The excitability of the $Eu^{2+}$-activated luminescence ranges from 220 nm in the UV range to 550 nm in the visible range, which means that the luminophores, according to exemplary embodiments of the present disclosure, may be excited with green light to produce yellow, orange, or red light. Furthermore, intense and technically attainable luminescence also occurs when the phosphors 3 having a very low Ca fraction are irradiated by electron beams, X-rays, or gamma rays.

The phosphors 3 having a very low Ca fraction may be used as radiation converters for converting ionizing gamma rays, X-rays, electron beams, and ultraviolet, blue, or green light into longer-wavelength visible light in the yellow, orange, and red range. Thus, the phosphors may be used alone or in combination with other blue-, green-, yellow- and/or red-emitting phosphors.

The phosphors 3 may be prepared on the basis of optional multistage high-temperature solid-state reactions between alkaline earth metal carbonates or their corresponding oxides, which may be used as starting material, and finely divided $SiO_2$. It is also possible to add certain amounts of fluxes or mineralization additives such as $NH_4Cl$ and/or $NH_4F$, or certain alkali metal or alkaline earth metal fluorides, to the reaction mixture to promote reactivity and to adjust the particle size distribution of the resulting luminophores. These starting materials are thoroughly mixed and then heated for 1 to 48 hours, at temperatures of 1300 to 1700° C., in an inert or reducing atmosphere. The main heating phase may optionally include a plurality of heating stages performed in different temperature ranges, so as to optimize the properties of the phosphors. After the end of the heating process, the samples are cooled to room temperature and subjected to suitable post-treatment processes, which are intended, for example, to eliminate flux residues, minimize surface defects, or finely adjust particle size distribution. Instead of finely divided silica, silicon nitride ($Si_3N_4$) may also be used as a reactant for reaction with the alkaline earth metal compounds.

From this point of view, it should be understood that the preparation of the present phosphors is not limited to the aforementioned processes. A detailed description of the preparation of the phosphors having a low Ca fraction is described below in the following Examples.

EXAMPLE 1

For the preparation of phosphors having the composition $Sr_{2.9285}Ca_{0.03}Cu_{0.0015}SiO_5:EU_{0.04}$, 432.4 g of $SrCO_3$, 3.0 g of $CaCO_3$, 0.12 g of CuO, 7.04 g of $Eu_2O$ and 60.94 g of $SiO_2$ were used as starting materials, to which 1.5 g of $NH_4F$ was added as a flux. After thorough homogenization, the batch mixtures were transferred to corundum crucibles, which were positioned in a high-temperature furnace. In the furnace, the solid mixtures were subjected to a heating regime that has a first 3 hour holding stage at 1200° C. and a second 5 hour holding stage at 1550° C. The heating stages were conducted in pure oxygen until the process reached 1550° C. and in an $N_2/H_2$ mixture that contained 20% hydrogen during the 1550° C. stage. After the heating process, the resultant material was cooled and subjected to post-treatment, which includes milling, washing, and drying and screening, to produce a final product.

EXAMPLE 2

For the preparation of alkaline earth metal oxyorthosilicate phosphors having a composition of $Sr_{2.91}Ca_{0.04}Ba_{0.01}SiO_5:Eu_{0.04}$, 429.6 g of $SrCo_3$, 1.97 g of $BaCO_3$, 4.01 g of $CaCO_3$, 7.04 g of $Eu_2O_3$, 60.9 g of $SiO_2$ and 0.54 g of $NH_4Cl$ were thoroughly mixed and then heated at 1380° C. for 6 hours, in an $N_2/H_2$ atmosphere comprising 20% hydrogen. After the end of the heating process, the resultant material was homogenized by milling and then subjected to heat treatment at 1350° C. for two hours, in a reducing $N_2/H_2$ atmosphere having a hydrogen concentration of at least 5%. The final post-treatment of the synthesized phosphor sample was performed as in Example 1.

Figure 6:
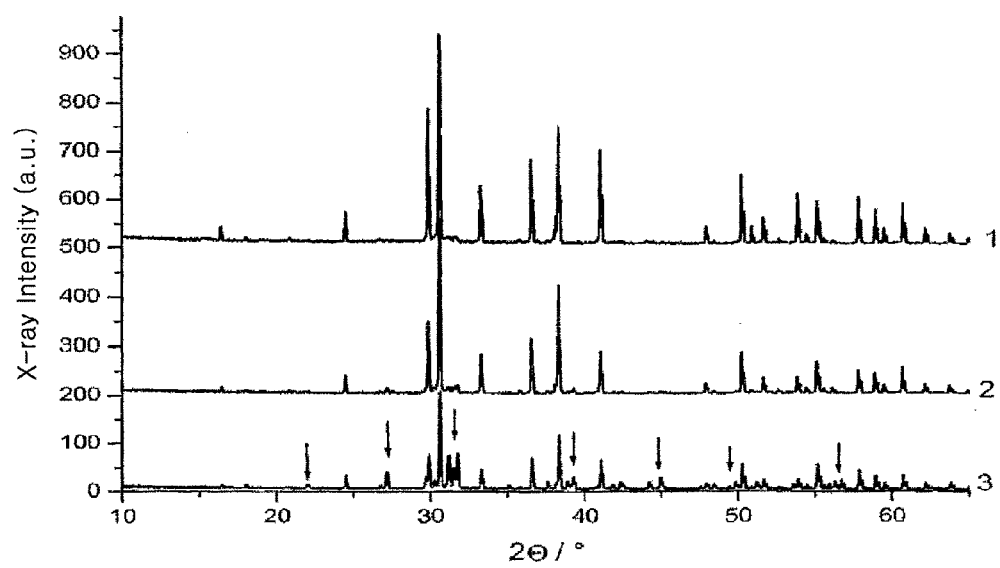
FIG. 6 shows X-ray diffraction diagrams of $Sr_3SiO_5$:Eu phosphors having different compositions.

FIG. 6 shows X-ray diffraction diagrams of europium-activated strontium oxyorthosilicate phosphors that have different fractions of calcium. Diffraction diagram 1 relates to a Comparative Material represented by $Sr_{2.95}Ba_{0.01}Eu_{0.04}SiO_5$. Diffraction diagram 2 relates to a $Sr_3SiO_5$-based phosphor represented by $Sr_{2.95}Ba_{0.01}Ca_{0.02}Eu_{0.04}SiO_5$. Diffraction diagram 3 shows another $Sr_3SiO_5$-based phosphor represented by $Sr_{28}Ba_{0.01}Ca_{0.15}Eu_{0.04}SiO_5$. Arrows in the diagrams represent reflection characteristics of a $Sr_2SiO_4$ foreign phase structure.

Figure 7:
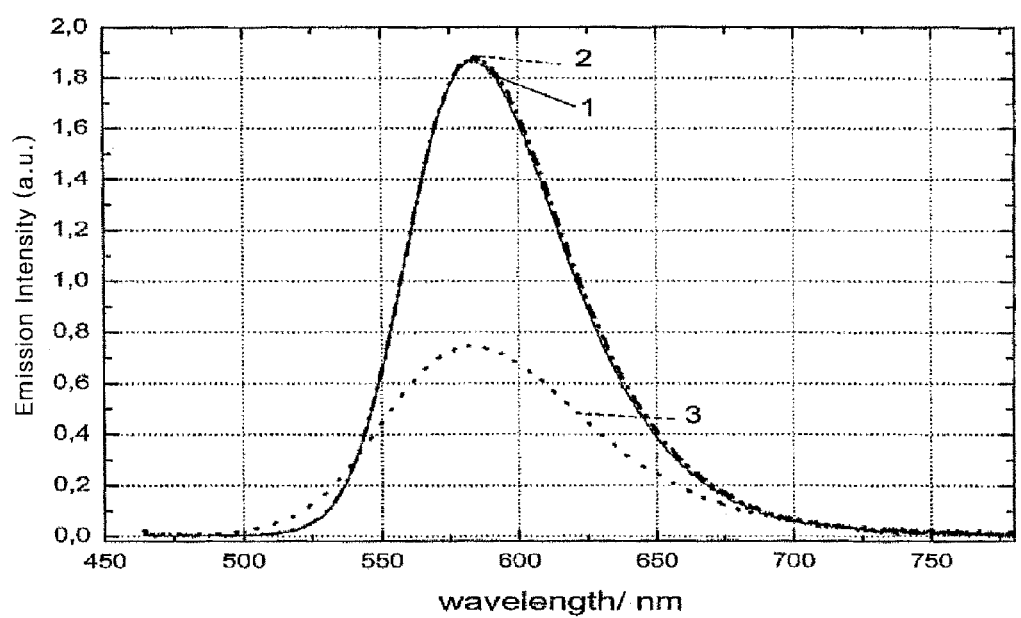
FIG. 7 shows emission spectra of luminophores having a very low Ca molar fraction and of comparative luminophores.

FIG. 7 shows emission spectra of luminophores having selectively low calcium fractions and of the comparative material. The reference material represented by $Sr_{2.95}Ba_{0.01}Eu_{0.04}SiO_5$ produced Spectrum 1. The phosphor represented by $Sr_{2.95}Ba_{0.01}Ca_{0.02}Eu_{0.04}SiO_5$ produced Spectrum 2, and the phosphor represented by $Sr_{2.95}Ba_{0.01}Ca_{0.02}Eu_{0.04}SiO_5$ produced Spectrum 3.

For the pure $Sr_3SiO_5$ phase and for an $Sr_{3-x-y-z}Ca_xBa_{0.01}SiO_5$ parent lattice having a calcium molar fraction of x=0.05, only the characteristic reflection of the $Sr_3SiO_5$ structure in the literature was found in the diffractogram, and the diffraction angle of the calcium-substituted material had a slight shift relative to that of the pure $Si_3SiO_5$ phase, as expected. In contrast, for the $Sr_{3-x-y-z}Ca_xBa_{0.01}SiO_5:Eu_z$ phosphors having a calcium molar fraction of x=0.1, the characteristic reflection of $Sr_2SiO_5$ type orthosilicate compounds was also obtained with high intensity, in addition to the characteristic reflection of the $Sr_3SiO_5$ phase.

FIG. 8 lists lattice constants and fractions of different crystallographic phases, as calculated from the diffractogram, of a series of compounds that were prepared by a method similar to the method described in Example 1 and had increased amounts of calcium in the $Sr_3SiO_5$ matrix. As shown in FIG. 8, principally, an increase in the added amount of calcium first leads to a reduction in the lattice constant of the $Sr_3SiO_5$ phase, and the corresponding values for luminophores having a calcium molar fraction of x<0.05 differ only slightly from one another. Larger deviations from the known literature values and the lattice constant of the reference material occur only in the case of calcium molar fractions of x>0.05.

However, effect of an increased calcium concentration is not limited to the additional reduction of the lattice constant. As shown by the data listed in FIG. 8, for the percentage phase composition of the materials resulting in the case of increased calcium addition, a mixture of $Sr_3SiO_5$ and $Sr_2SiO_4$ phases is increasingly formed with increasing calcium fractions. Instead of the $Sr_3SiO_5$ structure type oxyorthosilicates, the proportion of the orthosilicate phase is already 42% when a calcium molar fraction x is 0.01, based on the total mixture.

It is also evident from FIG. 8 that the oxyorthosilicate phosphors according to the exemplary embodiments, as well as the calcium-free reference material, have small traces of an orthosilicate foreign phase corresponding thereto. This phenomenon is known in the art and may be attributed to partial phase transformation upon cooling of the corresponding heated products, which could be ruled out in high temperature synthesis of phosphors, only with an unacceptably great effort. However, the efficiency of oxyorthosilicate luminophores has essentially been proven not to be influenced by such extremely small foreign phase fractions.

Both luminescent efficiencies and temperature dependencies of the phosphors according to the exemplary embodiments are not inferior to those of commercially available $Sr_3SiO_5$:Eu phosphors. As demonstrated by the results listed in FIG. 9 for corresponding measurements, phosphors having comparable or higher luminescence output may be prepared on the basis of the preparation methods described in Examples 1 and 2.

In the case of the phosphors, slight shifts from the maximum emission peak wavelengths to greater wavelengths were initially found with increasing calcium content. This could be attributed to a growing crystal field resulting from the reduction of the lattice constant. Together with the crystallographic findings, such shifts of the optical parameters of the luminophores are also reliable indicators that the added amounts of calcium in the exemplary embodiments are also actually incorporated in the described concentration range, into the $Sr_3SiO_5$ lattice.

On the other hand, calcium addition exceeding x=0.05 results in silicate mixed phases, of which luminescence properties are characterized by reduced efficiency, broadened emission spectrum, and reduced temperature stability. This is also clear from FIG. 7, in which the emission spectra of the exemplary phosphors were compared with those of the reference materials and calcium-rich phases.

To evaluate moisture stability of the materials, the corresponding phosphor samples were stored in a conditioned chamber, at a temperature of 85° C. and a relative humidity of 85%, for 7 days. Thereafter, the luminophores were dried at 150° C. and then subjected to comparative measurement of luminescence. Results of such investigations are listed in FIG. 10. The data in FIG. 10 shows that both commercially available $Sr_3SiO_5$:Eu and $(Sr_{2.95}Ba_{0.01}Eu_{0.04})SiO_5$ phosphors prepared for reference purposes have only about 70% of their initial luminescent efficiency, after the described procedure involving storage in a moist atmosphere.

However, the $Sr_3SiO_5$:Eu type europium-doped oxyorthosilicate phosphors according to the exemplary embodiments, in which a small fraction of strontium was selectively replaced by calcium, had substantially improved moisture resistance, without adversely affecting the formation of the $Sr_3SiO_5$ structure. After storage for 7 days in an 85° C./85% relative humidity atmosphere, luminescence yields of >90%, and of >95% were found.

It will be apparent to those skilled in the art that various modifications and variation can be made in the present exemplary embodiments, without departing from the spirit or scope of the present invention. Thus, it is intended that the present invention cover the modifications and variations of this invention provided they come within the scope of the appended claims and their equivalents.

What is claimed is:

1. A light emitting device, comprising:
   a light emitting diode; and
   phosphors to absorb light emitted from the light emitting diode and emit light having a different wavelength from the absorbed light, the phosphors having the general formula $M^I_{3-x-y-z}Ca_xM^{II}_ySiO_5$: $Eu_z$, wherein,
   $M^I$ is at least one element selected from Sr and Ba;
   $M^{II}$ is at least one element selected from Mg, Ba, Cu, Zn, and Mn;
   $0<x\le0.05$;
   $0\le y\le 0.5$; and
   $0<z\le 0.25$,
   wherein y does not equal x, and
   wherein the light emitted from the light emitting diode is mixed with the light emitted from the phosphors, to output a desired color of light.

2. The light emitting device of claim 1, wherein $M^I$ is Ba.

3. The light emitting device of claim 2, wherein $M^{II}$ is a divalent metal ion and comprises at least two of the divalent metal ions.

4. The light emitting device of claim 1, wherein the phosphors further comprise divalent rare earth metal ions or trivalent rare earth metal ions as an activator.

5. The light emitting device of claim 4, wherein the divalent rare earth metal ions comprise Sm ions or Yb ions.

6. The light emitting device of claim 4, wherein the trivalent rare earth metal ions comprise $Ce^{3+}$.

7. The light emitting device of claim 1, wherein the phosphors emit light having an emission peak wavelength in the range of 560~620 nm.

8. The light emitting device of claim 1, wherein the light emitting diode and the phosphors are combined in a single package.

9. The light emitting device of claim 8, further comprising: another light emitting diode in the package, wherein the other light emitting diode emits light having a longer emission peak wavelength than that of the phosphors.

10. The light emitting device of claim 9, further comprising a plurality of heat sinks, wherein each light emitting diode is respectively disposed on a heat sink of the plurality of heat sinks.

11. The light emitting device of claim 8, wherein the package further comprises a substrate, on which the light emitting diode is mounted.

12. The light emitting device of claim 11, wherein the substrate comprises a printed circuit board or a lead frame.

13. The light emitting device of claim 12, further comprising a molding member encapsulating the light emitting diode, wherein the phosphors are distributed within the molding member.

14. The light emitting device of claim 8, wherein the package comprises a heat sink on which the light emitting diode is mounted.

15. The light emitting device of claim 1, wherein the light emitting diode comprises a plurality of light emitting cells.

16. The light emitting device of claim 1, wherein $M^{II}$ comprises Cu.

17. The light emitting device of claim 1, wherein $M^{II}$ comprises Zn.

18. The light emitting device of claim 1, wherein $M^{II}$ comprises Mn.

19. A light emitting device, comprising:
a light emitting diode; and
phosphors to absorb light emitted from the light emitting diode and emit light having a different wavelength from the absorbed light, the phosphors having the general formula $M^{I}_{3-x-y-z}Ca_xM^{II}_ySiO_5: Eu_z$, wherein,
$M^{I}$ is at least one element selected from Sr and Ba;
$M^{II}$ is at least one element selected from Mg, Ba, Cu, Zn, and Mn;
$0<x\leq0.05$;
$0\leq y\leq0.5$; and
$0<z\leq0.25$,
wherein y does not equal x, and
wherein the light emitting diode and the phosphors are combined in a single package.

20. A light emitting device, comprising:
a light emitting diode; and
phosphors to absorb light emitted from the light emitting diode and emit light having a different wavelength from the absorbed light, the phosphors having the general formula $M^{I}_{3-x-y-z}Ca_xM^{II}_ySiO_5: Eu_z$, wherein,
$M^{I}$ is at least one element selected from Sr and Ba;
$M^{II}$ is at least one element selected from Mg, Ba, Cu, Zn, and Mn;
$0<x\leq0.05$;
$0\leq y\leq0.5$; and
$0<z\leq0.25$,
wherein y does not equal x, and
wherein the light emitting diode comprises a plurality of light emitting cells.

* * * * *